(12) United States Patent
Edwards

(10) Patent No.: US 11,411,070 B2
(45) Date of Patent: Aug. 9, 2022

(54) LOCOS WITH SIDEWALL SPACER FOR DIFFERENT CAPACITANCE DENSITY CAPACITORS

(71) Applicant: Texas Instruments Incorporated, Dallas, TX (US)

(72) Inventor: Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/897,373

(22) Filed: Jun. 10, 2020

(65) Prior Publication Data
US 2020/0303491 A1 Sep. 24, 2020

Related U.S. Application Data

(62) Division of application No. 16/156,827, filed on Oct. 10, 2018, now Pat. No. 10,707,296.

(51) Int. Cl.
| | |
|---|---|
| *H01L 49/02* | (2006.01) |
| *H01L 21/311* | (2006.01) |
| *H01L 21/3205* | (2006.01) |
| *H01L 21/762* | (2006.01) |
| *H01L 29/92* | (2006.01) |
| *H01L 21/32* | (2006.01) |

(Continued)

(52) U.S. Cl.
CPC ........ *H01L 28/60* (2013.01); *H01L 21/31105* (2013.01); *H01L 21/32055* (2013.01); *H01L 21/762* (2013.01); *H01L 21/76205* (2013.01); *H01L 29/92* (2013.01); *H01L 29/945* (2013.01)

(58) Field of Classification Search
CPC ....... H01L 2027/11833; H01L 29/7846; H01L 21/762; H01L 21/76202; H01L 21/76208; H01L 21/76235; H01L 29/92; H01L 29/945; H01L 27/0805; H01L 2924/1205; H01L 27/3265; H01L 2924/19041; H01L 27/10829; H01L 27/10861; H01L 27/10838; H01L 27/1802; H01L 27/10832; H01L 27/1085; H01L 27/10858; H01L 27/10876; H01L 27/10867
See application file for complete search history.

(56) References Cited

U.S. PATENT DOCUMENTS 4,334,236 A * 6/1982 Hoffmann ............... G11C 11/35
257/296
5,895,257 A 4/1999 Tsai et al.
(Continued)

FOREIGN PATENT DOCUMENTS

EP 3621119 A1 * 3/2020 ........ H01L 21/31111
WO 2017137864 A1 8/2017

*Primary Examiner* — Sonya McCall-Shepard
(74) *Attorney, Agent, or Firm* — Krista Y. Chan; Charles A. Brill; Frank D. Cimino

(57) ABSTRACT

An integrated circuit (IC) includes a first capacitor, a second capacitor, and functional circuitry configured together with the capacitors for realizing at least one circuit function in a semiconductor surface layer on a substrate. The capacitors include a top plate over a LOCal Oxidation of Silicon (LOCOS) oxide, wherein a thickness of the LOCOS oxide for the second capacitor is thicker than a thickness of the LOCOS oxide for the first capacitor. There is a contact for the top plate and a contact for a bottom plate for the first and second capacitors.

18 Claims, 10 Drawing Sheets

(51) Int. Cl.
*H01L 27/08* (2006.01)
*H01L 29/94* (2006.01)

(56) References Cited

U.S. PATENT DOCUMENTS

| | | | |
|---|---|---|---|
| 9,583,612 B1 | 2/2017 | Edwards et al. | |
| 9,887,288 B2 | 2/2018 | Edwards et al. | |
| 2003/0136988 A1 | 7/2003 | Zheng et al. | |
| 2012/0256177 A1 | 10/2012 | Yamazaki | |

* cited by examiner

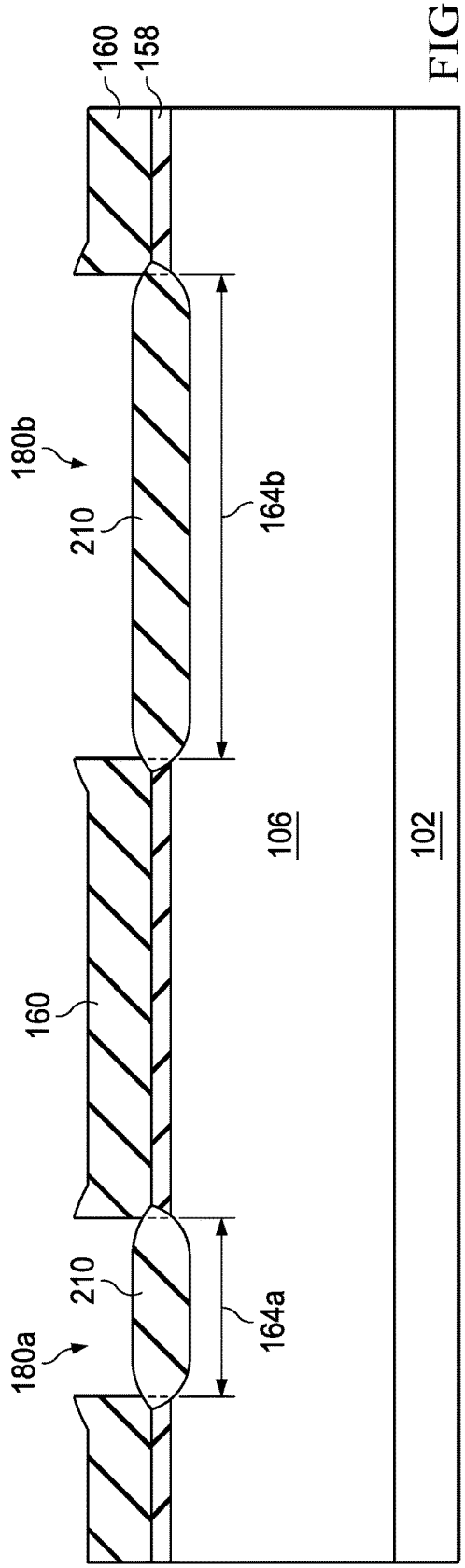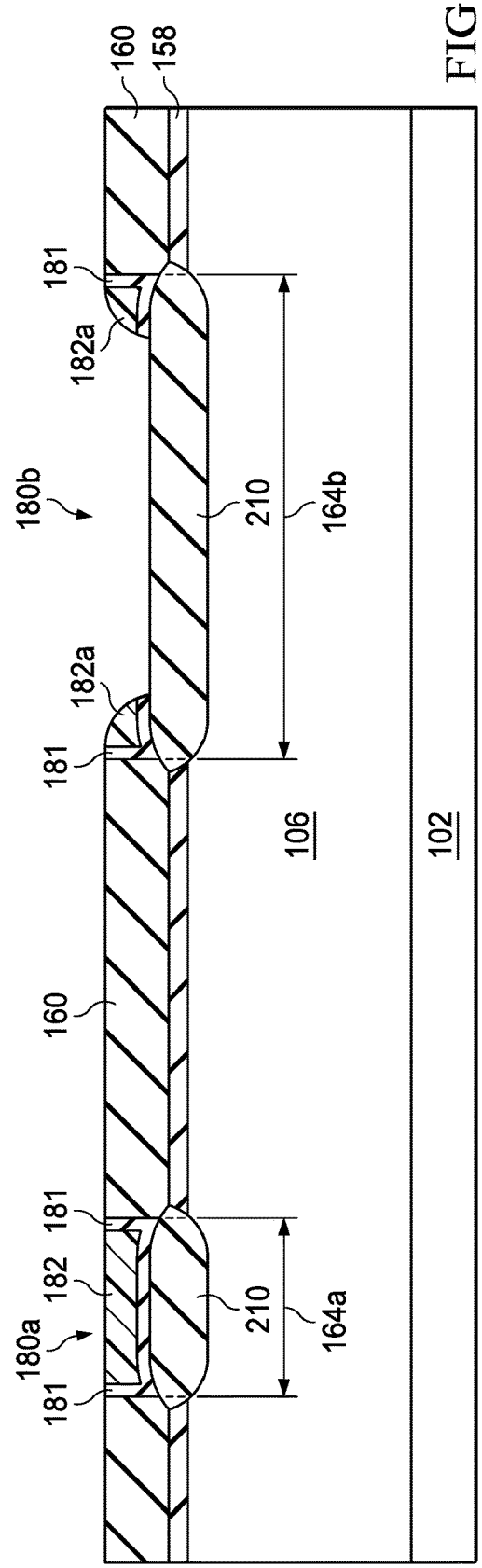

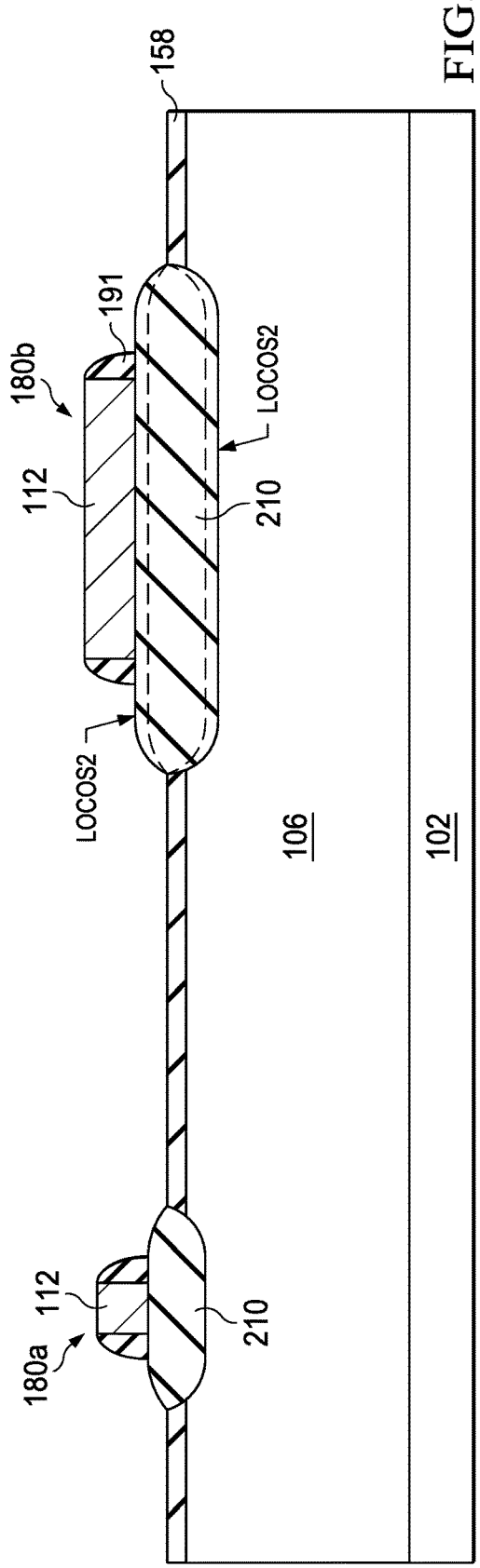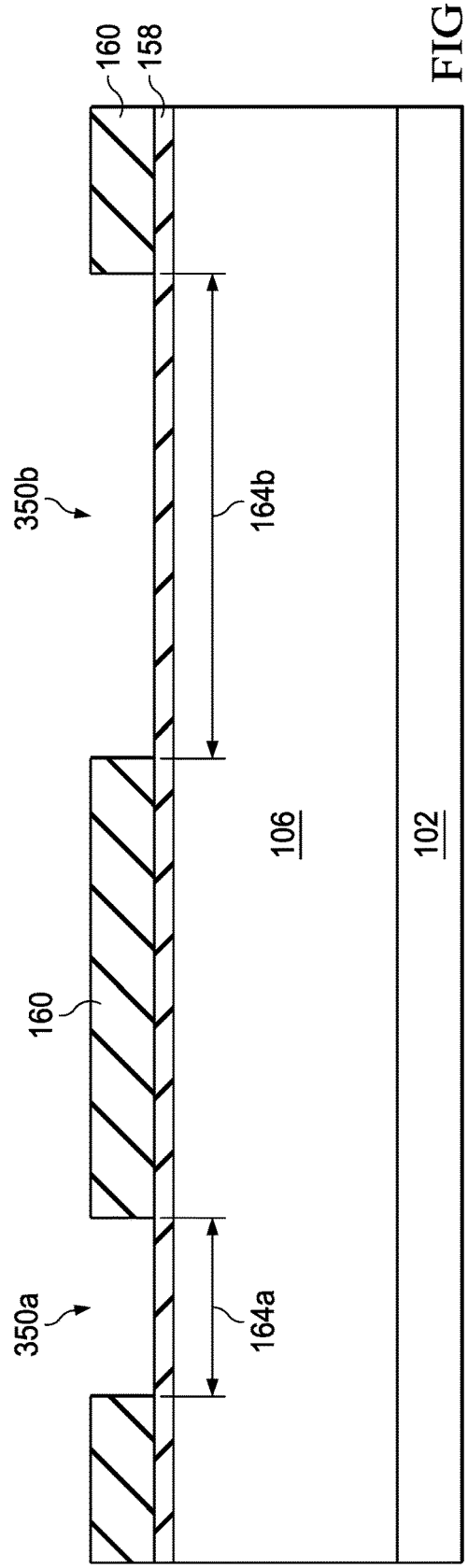

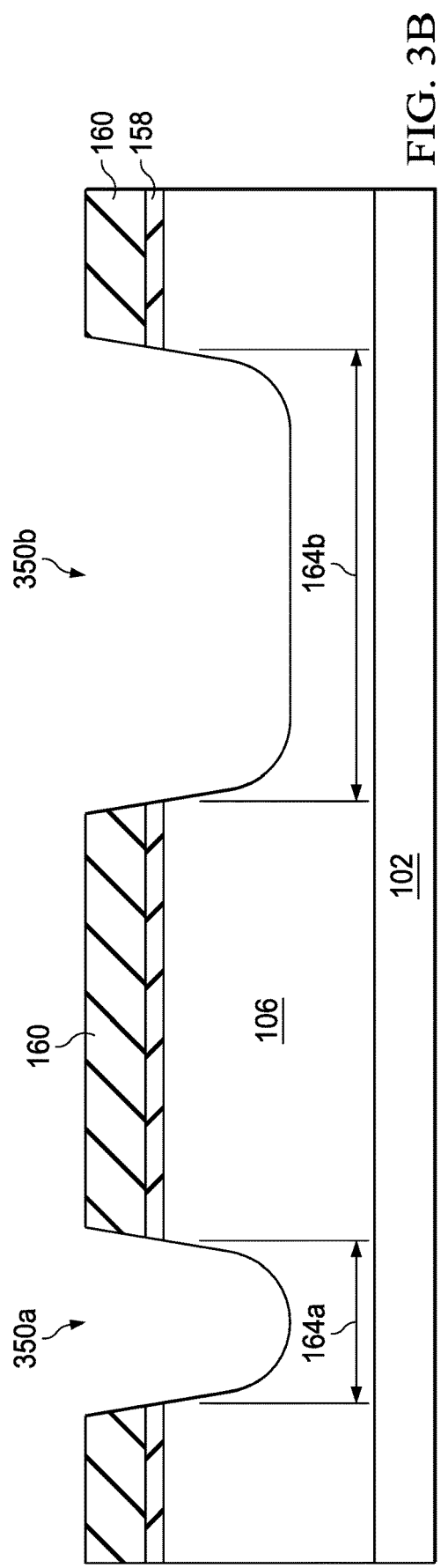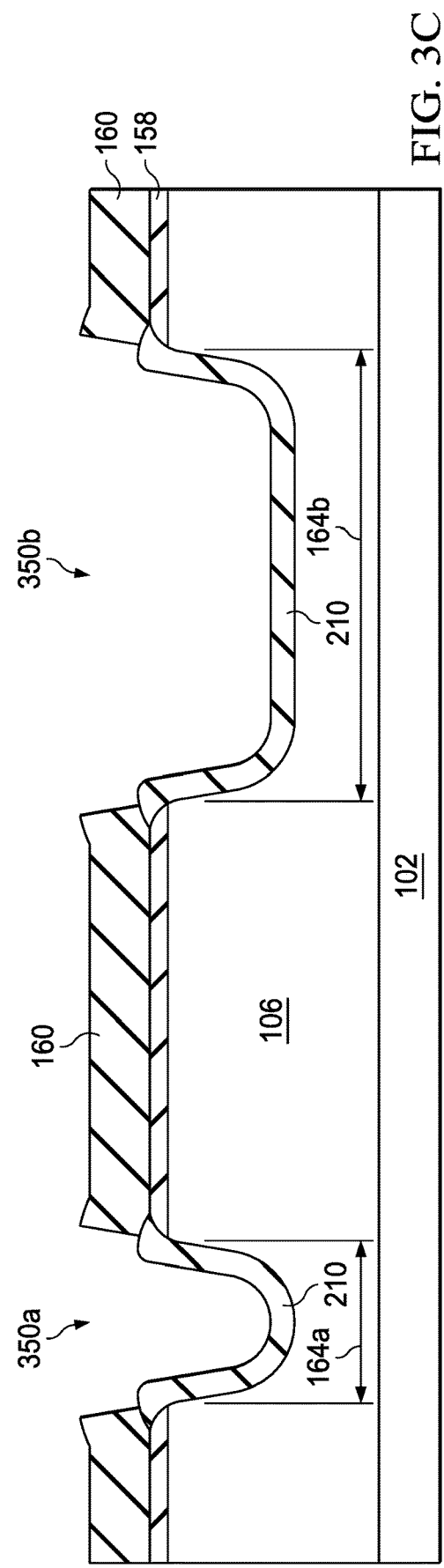

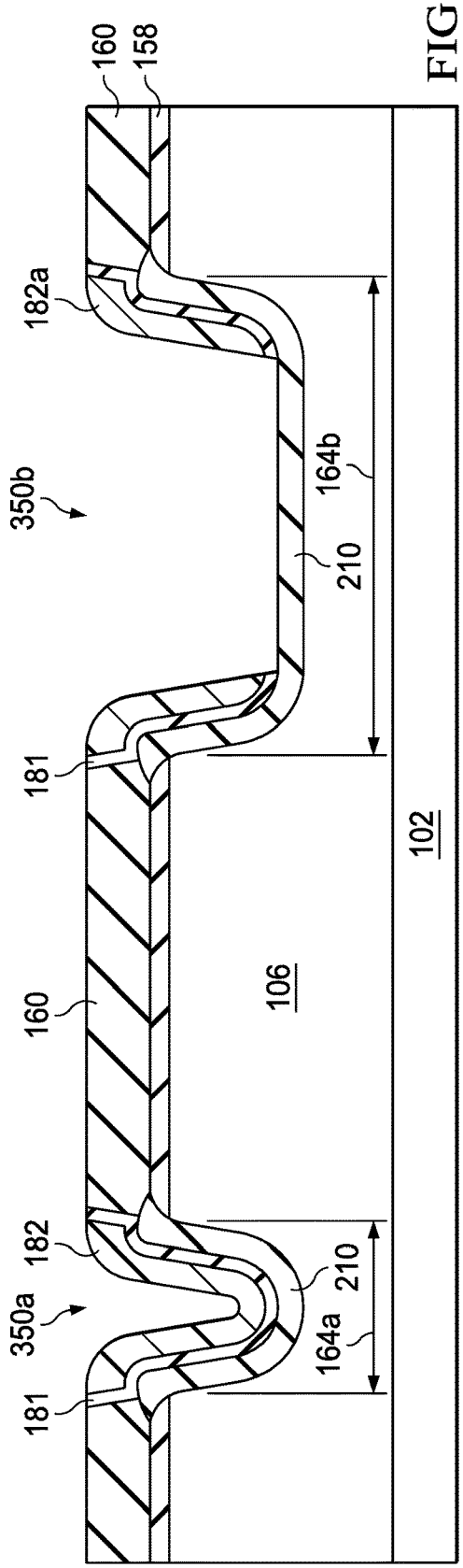
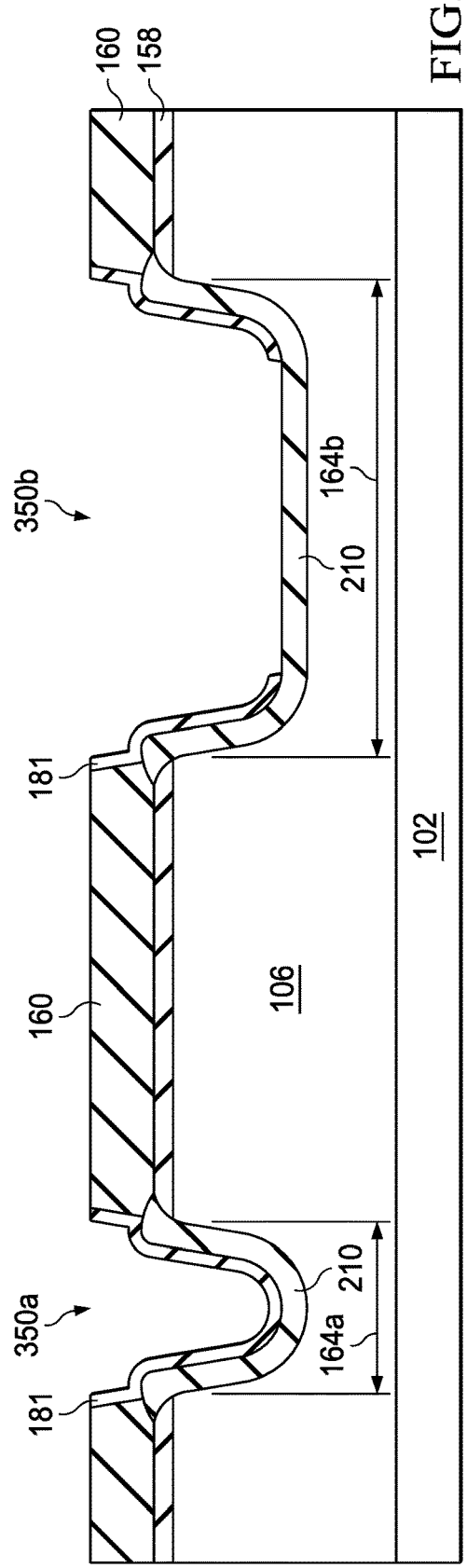

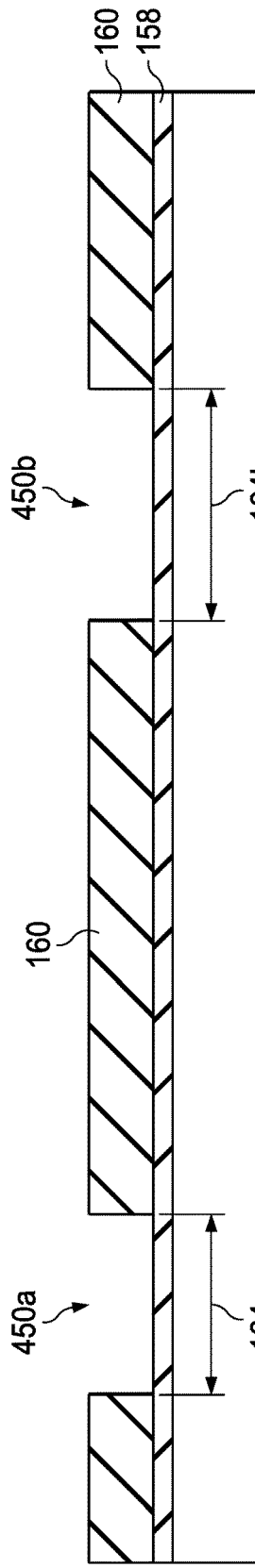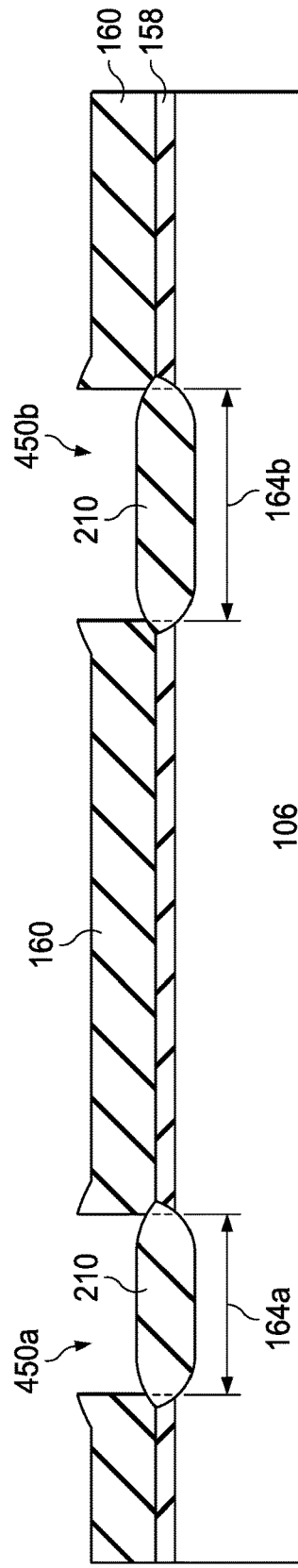

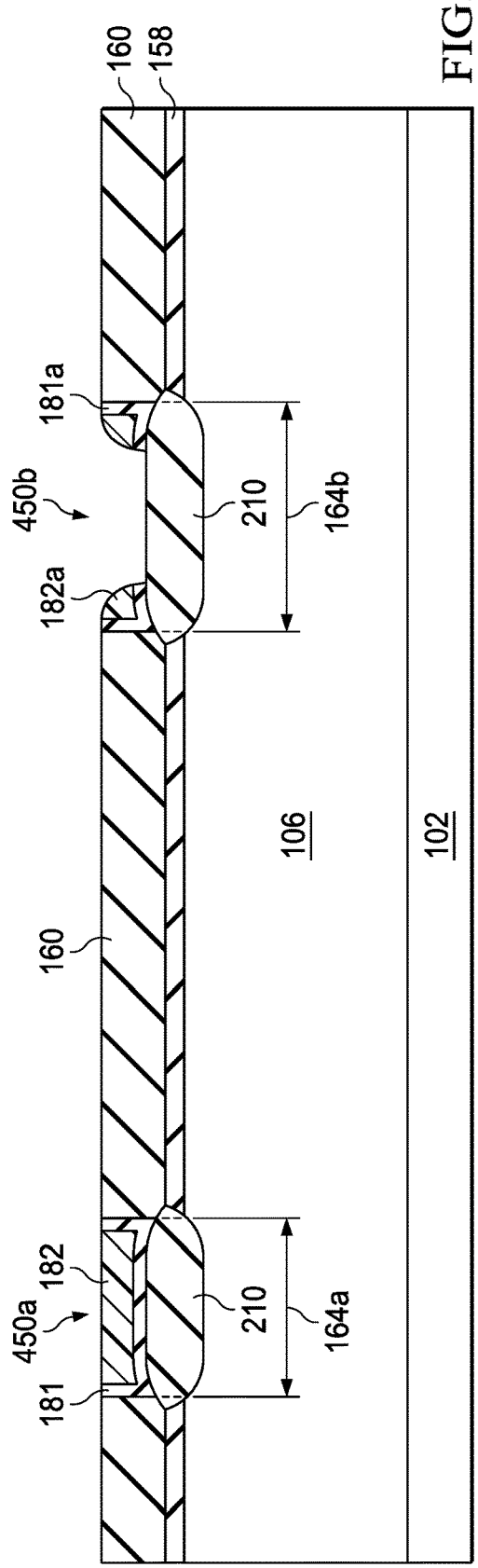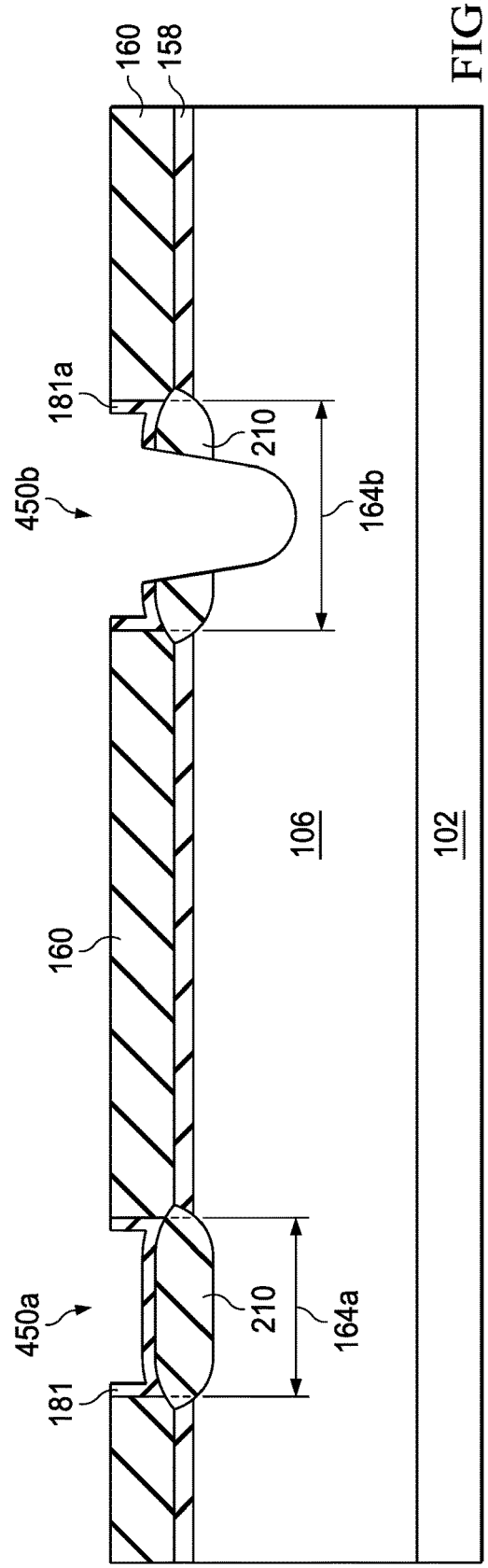

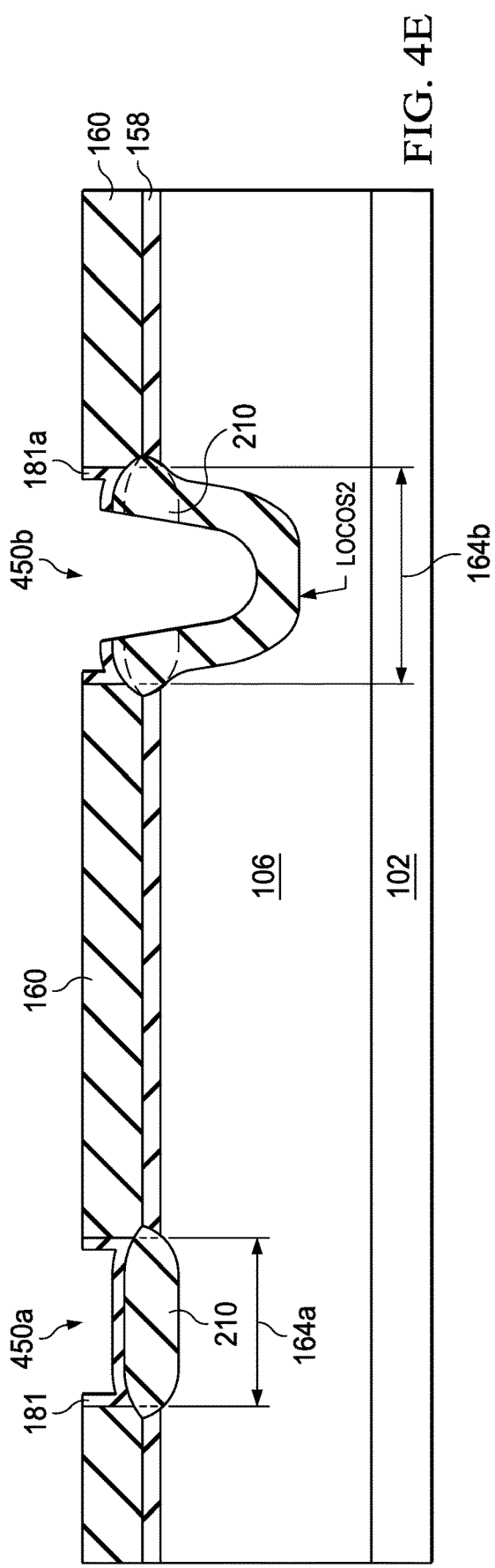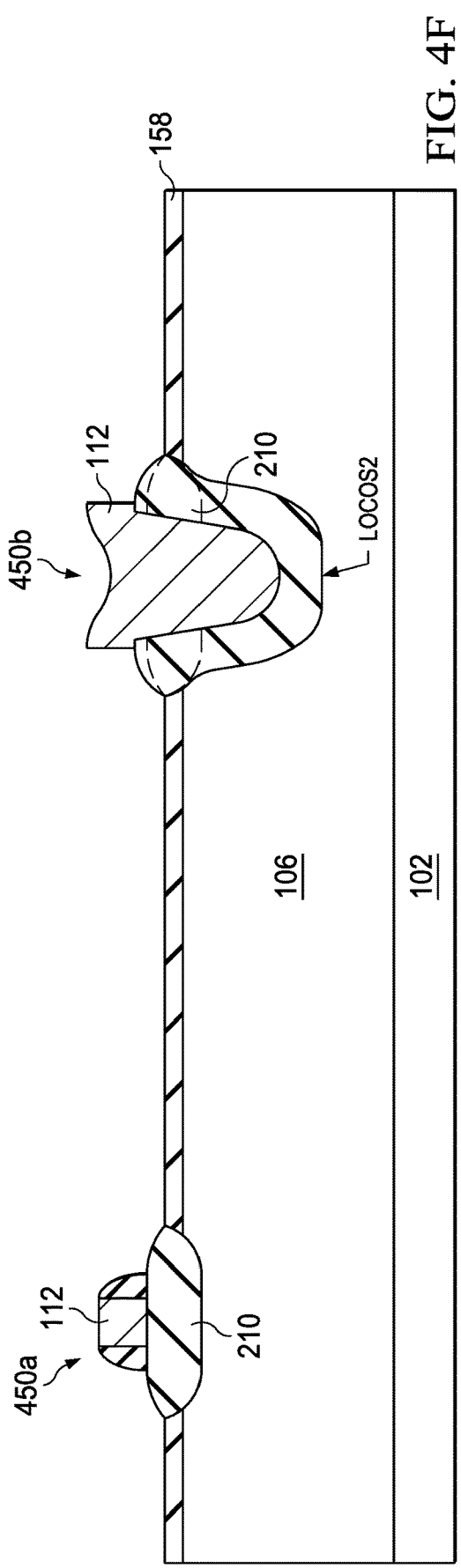

LOCOS WITH SIDEWALL SPACER FOR DIFFERENT CAPACITANCE DENSITY CAPACITORS

CROSS REFERENCE TO RELATED APPLICATIONS

This application is a divisional of U.S. Nonprovisional patent Ser. No. 16/156,827, filed Oct. 10, 2018, the contents of which are herein incorporated by reference in its entirety.

FIELD

This Disclosure relates to integrated circuits having LOCOS capacitors.

BACKGROUND

LOCal Oxidation of Silicon (LOCOS) is a semiconductor fabrication process that uses a patterned oxygen diffusion barrier layer, commonly a silicon nitride layer over areas not meant to be oxidized, where a thermally grown silicon dioxide layer is formed in etched apertures in the oxygen diffusion barrier layer at a given thickness, with a thinner tapered silicon oxide region being formed along the edges of the oxygen diffusion barrier layer. A Si-silicon oxide interface is formed at a lower point than the rest of the silicon surface. Some capacitors utilize a LOCOS oxide as their dielectric. Although the active areas widths bordered by a LOCOS oxide can be varied, LOCOS like other oxide growth processes provide a single given oxide thickness across the die and across the wafer.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an integrated circuit (IC) formed in a semiconductor surface layer on a substrate that includes a first capacitor and a second capacitor. The first and second capacitors include top plate over a LOCOS oxide, wherein the thickness of the LOCOS oxide for the second capacitor is thicker than the thickness of the LOCOS oxide for the first capacitor. There is a contact for the top plate and a contact for a bottom plate for both the first and second capacitors.

BRIEF DESCRIPTION OF THE DRAWINGS

Reference will now be made to the accompanying drawings, which are not necessarily drawn to scale, wherein:

FIGS. 2A-2F are cross-sectional diagrams showing processing progression for an example method of forming an IC having including a first and a second planar LOCOS capacitor having different capacitance densities, according to an example aspect.

FIGS. 3A-3G are cross-sectional diagrams showing processing progression for an example method of forming an IC including a first and a second trench LOCOS capacitor having different capacitance densities, according to an example aspect.

FIGS. 4A-4F are cross-sectional diagrams showing processing progression for another example method of forming an IC having a first planar LOCOS capacitor and a second trench LOCOS capacitor that have different capacitance densities, according to an example aspect.

DETAILED DESCRIPTION

Figure 1:
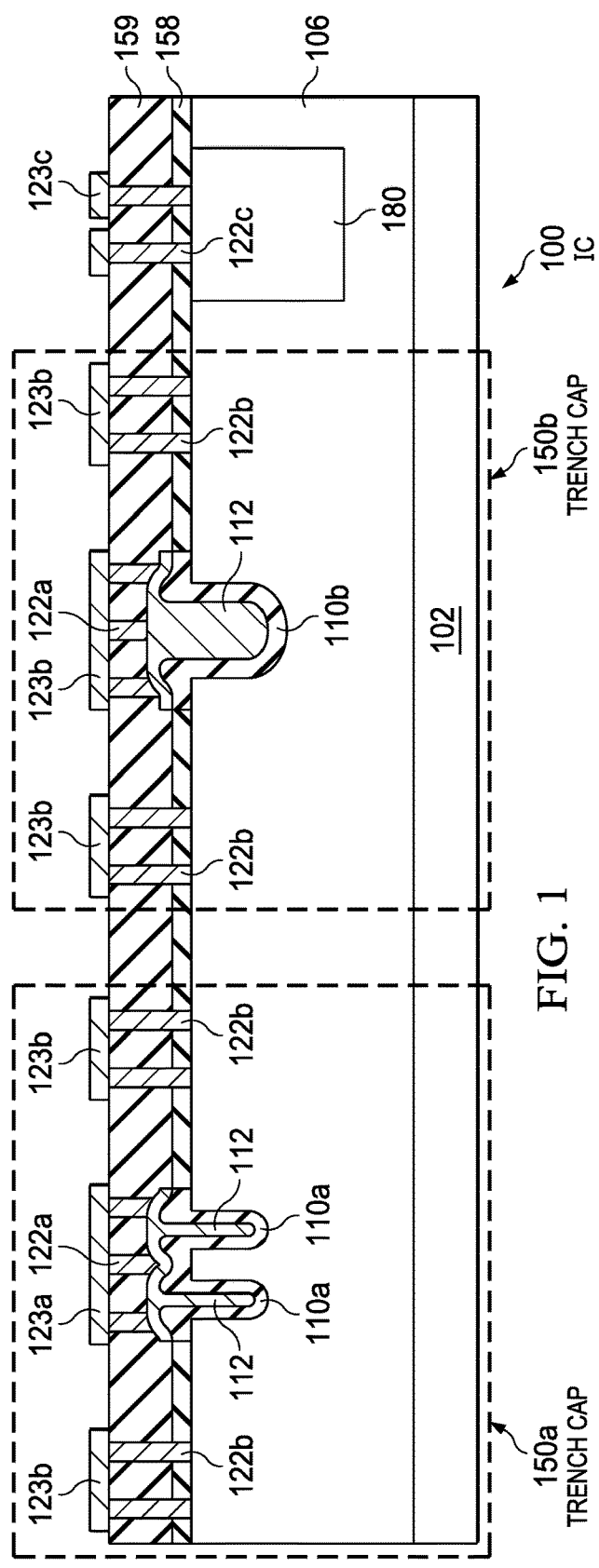
FIG. 1 is a cross sectional depiction of an example IC including a first and a second LOCOS capacitor that have different LOCOS oxide thicknesses to provide different capacitance densities, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize it is desirable to be able to form different capacitance density (capacitance/unit area) capacitors using a single masking level and a single patterning step. For some power transistors integrated into a Bipolar Complementary Metal Oxide Semiconductor (BiCMOS) process, this presents a cost and/or complexity problem, because multiple different capacitance density capacitors are needed to co-exist in the same technology, including in some cases on the same IC product. It is also recognized that known LOCOS approaches like other oxidation processes have the disadvantage of only providing a single oxide thickness. This Disclosure describes a LOCOS oxidation process flow that utilizes sidewall spacers to produce two or more distinct LOCOS oxide thicknesses.

Forming sidewall spacers in wider oxygen diffusion barrier (ODB) layer opening(s) over the semiconductor surface layer, but not forming sidewall spacers in a narrower width ODB layer opening(s) over the semiconductor surface enables creating at least two different LOCOS oxide thicknesses from a single mask level and patterning step. The thicker LOCOS oxide for planar LOCOS capacitors will be thicker in the thickest center region as well as in the thinner bird's beak region at the edge of the LOCOS oxide as compared to the thinner LOCOS oxide. Sidewall spacers (e.g., comprising silicon nitride) formed in a wider first ODB layer opening(s) but not in a narrower first ODB layer opening(s) creates two (or more) different LOCOS layer thicknesses, which thus depend on the width of the first ODB layer opening. The width of the wider first ODB layer opening (referred to herein as the $2^{nd}$ first ODB layer opening) is generally at least 0.05 μm wider than the width of the narrower first ODB layer opening (referred to herein as the $1^{st}$ first ODB layer opening).

FIG. 1 is a cross sectional depiction of an example IC 100 including a first trench capacitor 150a and a second trench capacitor 150b that have different LOCOS oxide thicknesses to provide different capacitance densities. The second trench capacitor 150b can be seen to be considerable wider and have a significantly thicker LOCOS oxide 110b thickness as compared to width and thickness of LOCOS oxide 110a for the first trench capacitor 150a. The trench capacitors 150a, 150b each have a top plate 112. The IC 100 also includes functional circuitry 180 shown as a block that comprises circuit elements (including transistors, and generally diodes, resistors, capacitors, etc.) formed in the semiconductor surface layer 106 of or on the substrate 102 that is configured together with the trench capacitors 150a and 150b for realizing at least one circuit function such as analog (e.g., an amplifier, power converter or power field effect transistor (FET)), RF, digital, or a memory function.

Although no field oxide is shown, IC 100 generally includes field oxide that may comprise a shallow trench isolation (STI) structure or the field oxide may also have a LOCOS oxide structure. A pre-metal dielectric (PMD) layer is shown as 159 and has thereunder a pad oxide layer as 158. Top side contacts are shown formed through the PMD layer 159 and the pad oxide layer 158 including contacts 122a to the top plates 112 and contacts 122b to the portion of the semiconductor surface layer 106 providing the bottom plates that have metal contacts 123a, and 123b shown as metal 1 (M1) contacts thereon. Top side contacts shown also include contacts 122c to the functional circuitry 180 having M1 contacts 123c thereon. Although the trench capacitor 150a is shown having 2 trenches, and trench capacitor 150b having one trench, disclosed trench capacitors can generally have any number of trenches.

Figure 2A:
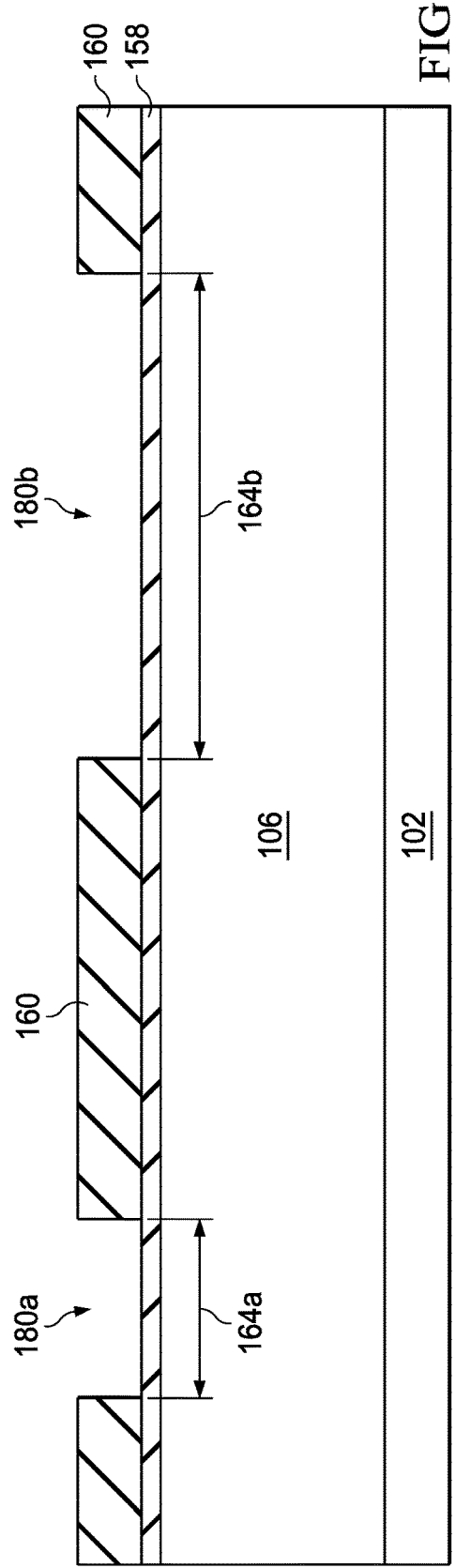

FIGS. 2A-2G are cross-sectional diagrams showing processing progression for an example method of forming an IC including a first planar capacitor 180a and a second planar capacitor 180b that have different LOCOS oxide thicknesses to provide different capacitance densities. Referring to FIG. 2A, the in-process IC is shown after forming a 1st first ODB layer opening 164a that is relatively narrower and a $2^{nd}$ first ODB layer opening 164b that is relatively wider in a first ODB layer 160 that is on a pad oxide layer 158 layer which is on semiconductor surface layer 106 of a substrate 102. The ODB layer openings 164a, 164b are generally formed using a photoresist pattern as an etch mask and then etching apertures including a first width and at least a second width in the first ODB layer 160.

The substrate 102 may be formed by starting with a p-type silicon wafer, possibly with at least one epitaxial layer thereon, and forming a n-type buried layer by implanting n-type dopants such as antimony or arsenic at a dose of $1 \times 10^{15}$ cm$^{-2}$ to $1 \times 10^{16}$ cm$^{-2}$. A thermal drive process heats the wafer to activate and diffuse the implanted n-type dopants. A p-type layer for the semiconductor surface layer 106 may be formed on the wafer by an epitaxial process with in-situ p-type doping. The epitaxially formed material may be, for example 4 microns to 6 microns thick. Although not shown, there may be an n-type buried layer that overlaps a boundary between the original silicon wafer and the epitaxially grown material for the semiconductor surface layer 106. An average bulk resistivity of the p-type layer may be, for example, 1 ohm-cm to 10 ohm-cm. An optional p-type buried layer may be also formed in the case of a p-type semiconductor surface layer 106 by implanting boron at an energy, for example, of 2 mega-electron volts (MeV) to 3 MeV.

The pad oxide layer 158 may be, for example, 20 to 250 A thick, 100 A thick being typical, and may be formed by thermal oxidation or by any of several chemical vapor deposition (CVD) processes. The first ODB layer 160 may include, for example, silicon nitride, such as formed by a low pressure chemical vapor deposition (LPCVD) process using dichlorosilane and ammonia. Alternatively, silicon nitride for the first ODB layer 160 may be formed by decomposition of bis(tertiary-butyl-amino) silane (BTBAS). Other processes to form the first ODB layer 160 are possible.

The etch mask may include photoresist formed by a photolithographic process, and may also include hard mask material such as amorphous carbon, and may include an anti-reflection layer such as an organic bottom anti-reflection coat (BARC). The exposed area of the top surface of the semiconductor surface layer 106 is defined by the $2^{nd}$ first ODB layer opening 164b for the second planar capacitor 180b has dimensions that are wider than a width of the $1^{st}$ first ODB layer opening 164a for the first planar capacitor 180a. The $2^{nd}$ first ODB layer opening 164b is sufficiently wide so that after etching the second ODB layer 181 as described below relative to FIG. 2C a central portion of the etched area becomes cleared resulting in the formation of sidewall spacers, while the $1^{st}$ first ODB layer opening 164a for the first planar capacitor 180a has a width narrow enough so that after etching the second ODB layer 181 the entire $1^{st}$ first ODB layer opening 164a remains covered with the second ODB layer 181. The first ODB layer 160 in areas exposed by the etch mask may be removed by a wet etch, for example an aqueous solution of phosphoric acid, which undercuts the etch mask. A portion of the pad oxide 158 may also be removed in the areas exposed by the etch mask.

Referring now to FIG. 2B, this FIG. shows results after growing a first LOCOS oxide layer 210, with a typical thickness of 200 to 1,000 A. The characteristic LOCOS oxidation bird's beak with a thinner LOCOS oxide at the edges under the first ODB layer 160 is shown.

An example furnace thermal oxidation process for growing a first LOCOS oxide layer 210 may include ramping a temperature of the furnace to about 1000° C. in a time period of 45 minutes to 90 minutes with an ambient of 2 percent to 10 percent oxygen, maintaining the temperature of the furnace at about 1000° C. for a time period of 10 minutes to 20 minutes while increasing the oxygen in the ambient to 80 percent to 95 percent oxygen, maintaining the temperature of the furnace at about 1000° C. for a time period of 60 minutes to 120 minutes while maintaining the oxygen in the ambient at 80 percent to 95 percent oxygen and adding hydrogen chloride gas to the ambient, maintaining the temperature of the furnace at about 1000° C. for a time period of 30 minutes to 90 minutes while maintaining the oxygen in the ambient at 80 percent to 95 percent oxygen with no hydrogen chloride, and ramping the temperature of the furnace down in a nitrogen ambient.

FIG. 2C shows results after depositing a second ODB layer 181 then a sacrificial sidewall film 182 on the second ODB layer 181 that functions as a sacrificial sidewall layer, then maskless etching of the sacrificial sidewall film 182 to form spacers 182a in the $2^{nd}$ first ODB layer opening 164b as it is sufficiently wide. The second ODB layer 181 is removed in the $2^{nd}$ first ODB layer opening 164b because it is not protected by the sacrificial sidewall film 182. Sidewall spacers are not shown in the $1^{st}$ first ODB layer opening 164a as it is narrower compared to the $2^{nd}$ first ODB layer opening 164b, so that the $1^{st}$ first ODB layer opening 164a is again shown as the sacrificial sidewall film 182 on the second ODB layer 181 in the $1^{st}$ first ODB layer opening 164a.

Figure 2D:
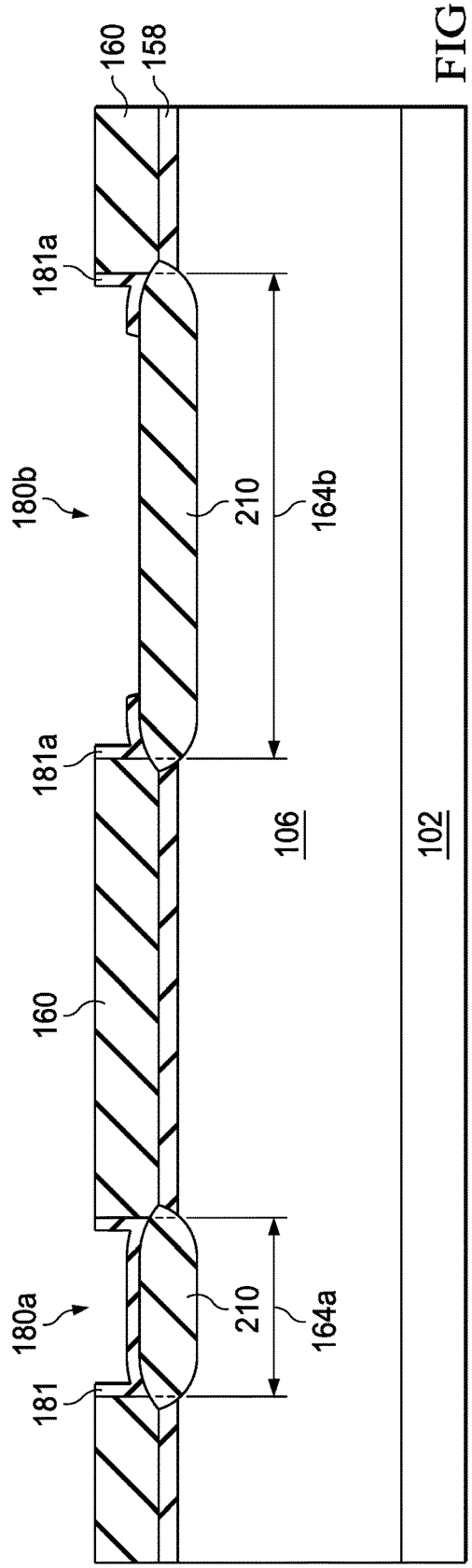
Figure 2E:
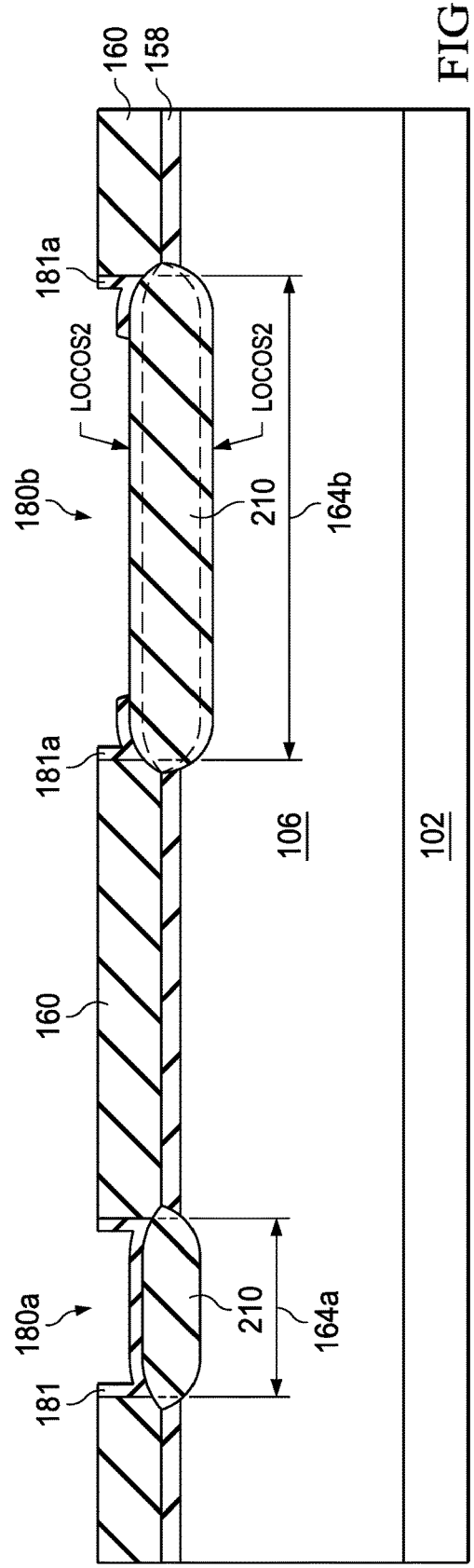

FIG. 2D shows results after stripping the sacrificial sidewall film 182 and spacers 182a which reveals spacers 181a in the $2^{nd}$ first ODB layer opening 164b. FIG. 2E shows results after growing a second LOCOS oxide layer resulting in an additional LOCOS portion shown as LOCOS 2 having a portion above and below the first LOCOS oxide layer 210, generally being 500 to 1,500 A of LOCOS 2 at the center of the wider $2^{nd}$ first ODB layer opening 164b for the second planar capacitor 180b, with no LOCOS 2 shown grown in the $1^{st}$ first ODB layer opening 164a being a narrower opening due to the presence of the second ODB layer 181 over the whole opening.

Thus for the $1^{st}$ first ODB layer opening 164a being narrower the sidewalls of the second ODB layer 181 remain merged so that only the first LOCOS oxidation process is able to oxidize the exposed silicon surface. This thinner LOCOS oxide is used to form all the oxide for the first planar capacitor 180a. For the $2^{nd}$ first ODB layer opening 164b being wider, the sidewalls are distinct (as shown as spacers 181a in FIG. 2D) so that the second LOCOS oxidation can thicken the LOCOS layer by adding LOCOS 2 in the $2^{nd}$ first ODB layer opening 164b. As with the first LOCOS oxide layer 210, the LOCOS 2 oxide will be tapered under the spacers 181a, which is equivalent to a bird's beak region.

This completes the oxide thickness so that the LOCOS oxide is thicker for the second planar capacitator 180b as it includes LOCOS oxide from both first LOCOS oxide layer 210 and the LOCOS 2 oxide as compared to the LOCOS oxide for the first planar capacitor 180a that only includes the first LOCOS oxide layer 210. FIG. 2F shows results after removing the first ODB layer 160 and the second ODB layer 181 and then depositing a top plate layer, and patterning this top plate layer to form top plates 112, such as a top plate comprising polysilicon over the LOCOS oxide for the first and second planar capacitors 180a, 180b. Spacers 191 are shown on the sidewalls of the top plates 112.

Figure 3F:
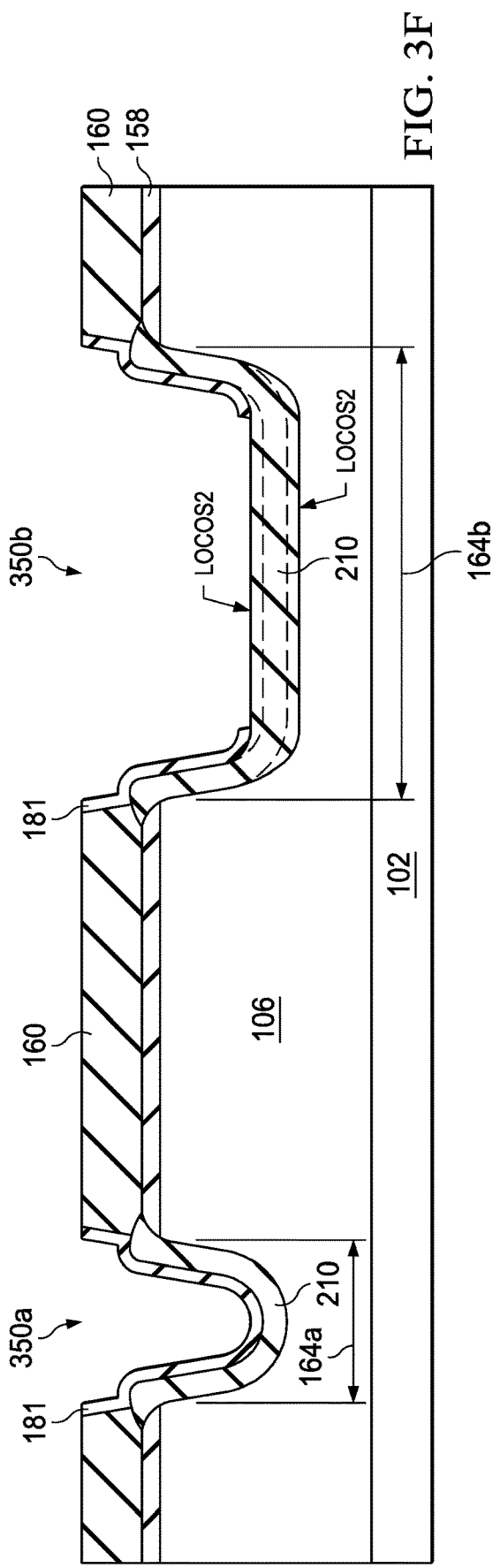

FIGS. 3A-3G are cross-sectional diagrams showing processing progression for an example method of forming an IC including a first trench capacitor 350a and a second trench capacitor 350b having different LOCOS oxide thicknesses to provide different capacitance densities. FIG. 3A shows results after forming a $1^{st}$ first ODB layer opening 164a (shown relatively narrower) and a $2^{nd}$ first ODB layer opening 164b (shown relatively wider) in a first ODB layer 160 that is on a pad oxide layer 158 layer that is on a semiconductor surface layer 106 on a substrate 102. The ODB layer openings are generally formed by using a photoresist patterned etch mask and then etching the first ODB layer 160 to form the $1^{st}$ first ODB layer opening 164a for the trench capacitor 350a and the $2^{nd}$ first ODB layer opening 164b for the trench capacitor 350b. FIG. 3B shows the results after a silicon etch of the top surface of the semiconductor surface layer 106 after an oxide etch to remove pad oxide 158 in the $1^{st}$ and $2^{nd}$ first ODB layer opening openings 164a, 164b. A typical silicon etch depth is 100 A to 6,000 A.

FIG. 3C shows results after growing a first LOCOS oxide layer 210, with a typical thickness of 200 to 1,000 A. The characteristic LOCOS oxidation bird's beak is shown. FIG. 3D shows results after results after depositing a second ODB layer 181 then a sacrificial sidewall film 182 on the second ODB layer 181 that functions as a sacrificial sidewall layer, then maskless etching the sacrificial sidewall film 182 to form spacers 182a in the $2^{nd}$ first ODB layer opening 164b being relatively wider, but not forming sidewall spacers show as sacrificial sidewall film 182 over the entire $1^{st}$ first ODB layer opening 164a being relatively narrower, and then removing the second ODB layer 181 where not protected by the sacrificial sidewall film 182. FIG. 3E shows results after results after removal of the sacrificial sidewall film 182 including spacers 182a.

FIG. 3F shows results after growing a second LOCOS oxide layer in the $2^{nd}$ first ODB layer opening 164b for the trench capacitor 350b resulting in an additional LOCOS portion shown as LOCOS 2 above and below the first LOCOS oxide layer 210, generally being 500 to 1,500 A of LOCOS at the center of the wider $2^{nd}$ first ODB layer opening 164b. There is no LOCOS 2 shown grown in the narrower first ODB layer opening 164a due to the presence of the second ODB layer 181 over the whole opening.

Thus for the narrower $1^{st}$ first ODB layer opening 164a the sidewalls of the second ODB layer 181 remain merged and only the first LOCOS oxidation process is able to oxidize the exposed silicon. This thinner oxide is used to form the LOCOS oxide for the trench capacitor 350a. For the wider $2^{nd}$ first ODB layer opening 164b, the sidewalls are distinct (as shown as spacers 182a in FIG. 3D), so that the second LOCOS oxidation adds LOCOS 2 which thickens the LOCOS layer in the middle of the $2^{nd}$ first ODB layer opening 164b for trench capacitor 350b. The LOCOS oxide will be tapered under the spacers 182a, which is equivalent to a bird's beak region that is controlled by the spacer thickness. This thicker LOCOS oxide is used to form the trench capacitor 350b.

Figure 3G:
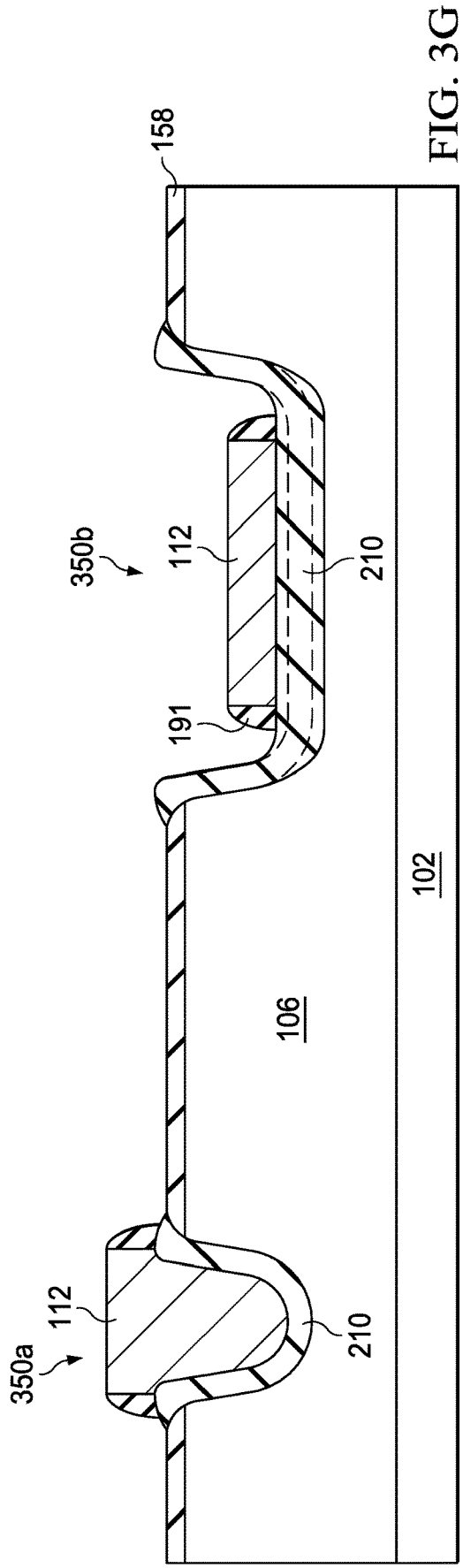

This completes the oxide thickness so that the LOCOS oxide is thicker for the trench capacitor 350b as compared to the LOCOS oxide for the trench capacitor 350a. FIG. 3G shows results after removing the first ODB layer 160 and the second ODB layer 181 and then forming a patterned top plate 112 that can comprise polysilicon over the LOCOS oxides for the trench capacitors 350a and 350b.

FIGS. 4A-4F are cross-sectional diagrams showing processing progression for another example method of forming an IC having including a first planar capacitor shown as 450a and a second trench capacitor shown as 450b having different LOCOS thicknesses, according to an example aspect. FIG. 4A shows results after forming a relatively narrower $1^{st}$ first ODB layer opening 164a for the first trench capacitor and a relatively wider $2^{nd}$ first ODB layer opening 164b for the second trench capacitor 164b in a first ODB layer 160 that is on a pad oxide layer 158 layer that is on a substrate 102 having a semiconductor surface layer 106. This process generally comprises using a photoresist patterned etch mask and then etching the first ODB layer 160 to form the $1^{st}$ and $2^{nd}$ first ODB layer openings 164a, 164b.

FIG. 4B shows results after growing a first LOCOS oxide layer 210, with a typical thickness of 200 to 1,000 A. The characteristic LOCOS oxidation bird's beak is shown. FIG. 4C shows results after depositing a second ODB layer 181, then depositing a sacrificial sidewall film 182 on the second ODB layer 181 that functions as a sacrificial sidewall layer, then maskless etching of the sacrificial sidewall film 182 and the second ODB layer 181. In the $2^{nd}$ first ODB layer opening 164b associated with the second trench capacitor 450b as it is relatively wider, etching of the sacrificial sidewall film 182 forms the spacers 182a shown which enables the maskless etching to etch the second ODB layer 181 away from the edges in the $2^{nd}$ first ODB layer opening 164b to form spacers 181a because the second ODB layer 181 is not protected there by the sacrificial sidewall film 182. Sidewall spacers are not shown in the 1st first ODB layer opening 164a associated with the first trench capacitor 450a as it is narrower so that after the maskless etching there is as a result the sacrificial sidewall film 182 on the second ODB layer 181 over the full area of the 1st first ODB layer opening 164a.

FIG. 4D shows results after stripping the sacrificial sidewall film 182 in the 1st first ODB layer opening 164a for the first trench capacitor 450*a* and the spacers 182*a* in the 2$^{nd}$ first ODB layer opening 164*b* for the second trench capacitor 450*b* and then silicon etching in the exposed semiconductor surface layer 106 in the 2$^{nd}$ first ODB layer opening 164*b*, where the second ODB layer 181 extending over the entire 1$^{st}$ first ODB layer opening 164*a* for the first trench capacitor 450*a* prevents any etching of the semiconductor surface layer 106. The silicon etch depth for the second trench capacitor 450*b* can be 100 A to 30 µm, with a typical silicon etch depth being 500 A to 2 µm.

FIG. 4E shows results after growing a second LOCOS oxide layer resulting in an a LOCOS portion shown as LOCOS 2 above and below the first LOCOS oxide layer 210, generally being 500 to 1,500 A of LOCOS oxide at the center of the wider 2$^{nd}$ first ODB layer opening 164*b* for the second trench capacitor 450*b*, with no LOCOS 2 shown grown in the narrower 1$^{st}$ first ODB layer opening 164*a* for the first trench capacitor 450*a* due to the presence of the second ODB layer 181 over the whole opening.

Thus for the narrower 1$^{st}$ first ODB layer opening 164*a* for the first trench capacitor 450*a* the sidewalls of the second ODB layer 181 remain merged and only the first LOCOS oxidation process is able to oxidize the exposed silicon. This thinner oxide is used to form the oxide for the first trench capacitor 450*a*. For the wider 2$^{nd}$ first ODB layer opening 164*b* for the second trench capacitor 450*b*, the sidewalls are distinct so the second LOCOS oxidation can grow in the middle of the 2$^{nd}$ first ODB layer opening 164*b*. The oxide will be tapered under the spacers 182*a*, which is equivalent to a bird's beak region that is controlled by the spacer thickness. This thicker oxide is used to form the trench capacitor 450*b*. FIG. 4E shows results after results after removal of the sacrificial sidewall film 182 including spacers 182*a*. FIG. 4F shows results after removing the first ODB layer 160 and the second ODB layer 181 and spacers 181*a*, and then forming a patterned top plate 112 that can comprise polysilicon over the LOCOS oxide for the trench capacitors 450*a*, 450*b*.

Described below is front-end-of-the-line (FEOL) MOS processing to complete formation of the capacitors comprising forming a top plate and contacts. A patterned layer of top plate material shown as 112 in FIG. 1 is formed over the layers of LOCOS oxide 110*a*, 110*b*. The top plate 112 may include, for example, polycrystalline silicon, referred to herein as polysilicon, possibly doped with n-type dopants. Polysilicon as the layer of top plate 112 may be, for example, 300 nanometers to 800 nanometers thick.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

What is claimed is:

1. An integrated circuit (IC), comprising:
   a first capacitor, a second capacitor, and functional circuitry;
   the first capacitor and the second capacitor comprising:
      a top plate over a LOCal Oxidation of Silicon (LOCOS) oxide layer, wherein a thickness of the LOCOS oxide layer for the second capacitor is thicker than a thickness of the LOCOS oxide layer for the first capacitor, wherein the LOCOS oxide layer is between the top plate and a bottom plate, wherein the thickness for the LOCOS oxide layer for the second capacitor is at least 500 Å thicker than the thickness for the LOCOS oxide layer for the first capacitor; and
      a contact for the top plate and a contact for the bottom plate for the first and second capacitors.

2. The IC of claim 1, wherein the first capacitor and the second capacitor both comprise planar capacitors.

3. The IC of claim 1, wherein the first capacitor and the second capacitor both comprise trench capacitors.

4. The IC of claim 3, wherein a semiconductor surface layer is recessed for the second capacitor as compared to the first capacitor.

5. The IC of claim 1, wherein a width of the LOCOS oxide layer for the second capacitor is at least 0.05 µm greater than a width of the LOCOS oxide layer for the first capacitor.

6. The IC of claim 1, wherein the top plate comprises polysilicon.

7. The IC of claim 1, wherein the contacts for the top plate and for the bottom plate for the first and the second capacitors are all top side contacts.

8. An integrated circuit (IC), comprising:
   a substrate having a semiconductor surface layer;
   a first capacitor comprising a first top plate over a LOCal Oxidation of Silicon (LOCOS) oxide layer, wherein a first portion of the semiconductor surface layer forms a first bottom plate of the first capacitor;
   a second capacitor comprising a second top plate over the LOCOS oxide layer, wherein a second portion of the semiconductor surface layer forms a second bottom plate of the second capacitor and wherein a thickness of the LOCOS oxide layer for the second capacitor is thicker than a thickness of the LOCOS oxide layer for the first capacitor, wherein a width of the LOCOS oxide layer for the second capacitor is at least 0.05 µm greater than a width of the LOCOS oxide layer for the first capacitor; and
   a contact for each of the first top plate, the second top plate, the first bottom plate, and the second bottom plate.

9. The IC of claim 8, wherein the thickness for the LOCOS oxide layer for the second capacitor is at least 500 Å thicker than the thickness for the LOCOS oxide layer for the first capacitor.

10. The IC of claim 8, wherein the first capacitor and the second capacitor both comprise planar capacitors.

11. The IC of claim 8, wherein the first capacitor and the second capacitor both comprise trench capacitors.

12. The IC of claim 11, wherein the semiconductor surface layer is recessed for the second capacitor as compared to the first capacitor.

13. The IC of claim 8, wherein the first top plate and the second top plate comprise polysilicon.

14. The IC of claim 8, wherein the contacts for the first and second top plates and for the first and second bottom plates are all top side contacts.

15. An integrated circuit (IC), comprising:
a substrate having a semiconductor surface layer;
a first capacitor comprising a first top plate over a LOCal Oxidation of Silicon (LOCOS) oxide layer, wherein a first portion of the semiconductor surface layer forms a first bottom plate of the first capacitor;
a second capacitor comprising a second top plate over the LOCOS oxide layer, wherein a second portion of the semiconductor surface layer forms a second bottom plate of the second capacitor and wherein a center thickness of the LOCOS oxide layer for the second capacitor is at least 500 Å thicker than a center thickness of the LOCOS oxide layer for the first capacitor and wherein a width of the LOCOS oxide for the second capacitor is at least 0.05 µm greater than a width of the LOCOS oxide for the first capacitor; and
a contact for each of the first top plate, the second top plate, the first bottom plate, and the second bottom plate.

16. The IC of claim 15, wherein the first capacitor and the second capacitor both comprise planar capacitors.

17. The IC of claim 15, wherein the first capacitor and the second capacitor both comprise trench capacitors.

18. The IC of claim 17, wherein the semiconductor surface layer is recessed for the second capacitor as compared to the first capacitor.

\* \* \* \* \*